United States Patent [19]
Krone

[11] 3,988,644
[45] Oct. 26, 1976

[54] CURRENT PROTECTION CIRCUIT
[75] Inventor: Kenneth Theodore Krone, Coral Springs, Fla.
[73] Assignee: Motorola, Inc., Schaumburg, Ill.
[22] Filed: Sept. 26, 1975
[21] Appl. No.: 616,986

[52] U.S. Cl. .......................... 317/33 R; 307/235 J; 330/207 P
[51] Int. Cl.² ........................................ H03K 5/20
[58] Field of Search ................... 307/235 J, 235 T; 330/207 P; 317/31 R, 33 R

[56] References Cited
UNITED STATES PATENTS
3,604,949  9/1971  Conzelmann et al. .......... 307/235 T
3,872,323  3/1975  Frederiksen et al. ........... 307/235 T

*Primary Examiner*—Harry Moose
*Attorney, Agent, or Firm*—Donald B. Southard; James W. Gillman

[57] ABSTRACT

An integrated circuit, current protection network wherein the point of operation (trip point) can be changed over a wide range of values by proportioning the areas of the junctions of semiconductor devices. A pair of transistors form a high gain differential amplifier, with the emitter electrodes of the transistors connected to the ends of a sense resistor through which current flows to the device to be protected. Diodes are connected between the base and emitter electrodes of the two transistors with the same polarities as the junctions, so that the current flow through the transistors will be in accordance with the areas of the junctions of the transistors and diodes. During construction of the integrated circuit, the areas of the junctions can be selected to provide the desired trip point for the network. A differential to single ended converter load circuit is connected to the collector electrodes of the transistors, and controls the protected device when the trip point is reached. The load circuit can be a part of the integrated circuit, and the areas of the junctions can also be proportioned to further control the trip point. As the sense resistor and a current limiting resistor for the diodes are the only resistors required, the network is adapted for construction in integrated circuit form.

10 Claims, 2 Drawing Figures

CURRENT PROTECTION CIRCUIT

BACKGROUND OF THE INVENTION

In many applications, it is desired to provide a current protection circuit for an electronic device which is constructed in integrated circuit form. In such case, it is preferable to also provide the protection network in integrated form, so that it can be placed on the same integrated circuit chip. However, known protection circuits require the use of a large number of resistors, and the point at which the circuit operates depends upon the values of one or more resistors. Also, the values of the resistors are critical, and to change the trip point requires changing the resistors, which requires changes in the integrated circuit. Further, to provide an adequate current responsive signal to operate the protection circuit requires the responsive signal to operate the protection circuit requires the use of a resistor which consumes substantial power to provide the voltage drop.

Known protection circuits are also subject to change in the trip point in response to changes in temperature, and/or operating voltage, which change the values of currents in the circuit. This requires the use of additional components to provide compensation, which complicates the circuit and increases the cost.

SUMMARY OF THE INVENTION

It is an object of this invention to provide an improved electronic current protection network.

Another object of the invention is to provide a current protection network having a minimum number of resistors and which is suitable for construction in integrated circuit form.

A further object of the invention is to provide an integrated circuit, current protection network wherein the trip point can be adjusted over a wide range of values by selection of the geometry of the semiconductor junctions.

A still further object of the invention is to provide an integrated circuit, current protection network wherein the trip point is independent of process variations in the integrated circuit construction, and depends only on the ratios of the areas of the semiconductor junctions.

Still another object of the invention is to provide an improved current protection network wherein the trip point is not affected by changes in temperature and variations in the supply voltages.

In accordance with the invention, an integrated circuit, current protection network is provided which includes a sense resistor through which current is applied to the device being protected, and a high gain differential amplifier with a pair of transistors having emitter electrodes connected to the ends of the sense resistor. The voltage at the device end of the sense resistor is therefore dropped by a value which is related to the amount of current flowing, with the voltage drop increasing as greater current is drawn. A diode is connected across the emitter-to-base junction of each of the two transistors, and the base electrodes of the transistors are connected together and are connected by a current limiting resistor to the reference point of the current supply, so that the current through the limiting resistor is divided between the diodes. The diodes are connected with the same polarity as the emitter-to-base junctions of the transistors and control the current therethrough in accordance with the ratio of the areas of the junctions. A differential to single ended load circuit is connected to the collector electrodes of the differential transistors and controls a stage which operates in response to the protection circuit to protect the device. This load circuit can include a transistor and a diode, or a single multiple collector transistor. In addition to the ratios of the junction areas of the differential transistors and of the diodes, the areas of the junctions in the load circuit can be selected in a desired ratio to further increase the range of values of the trip point at which the protection circuit operates.

DETAILED DESCRIPTION

Figure 1:
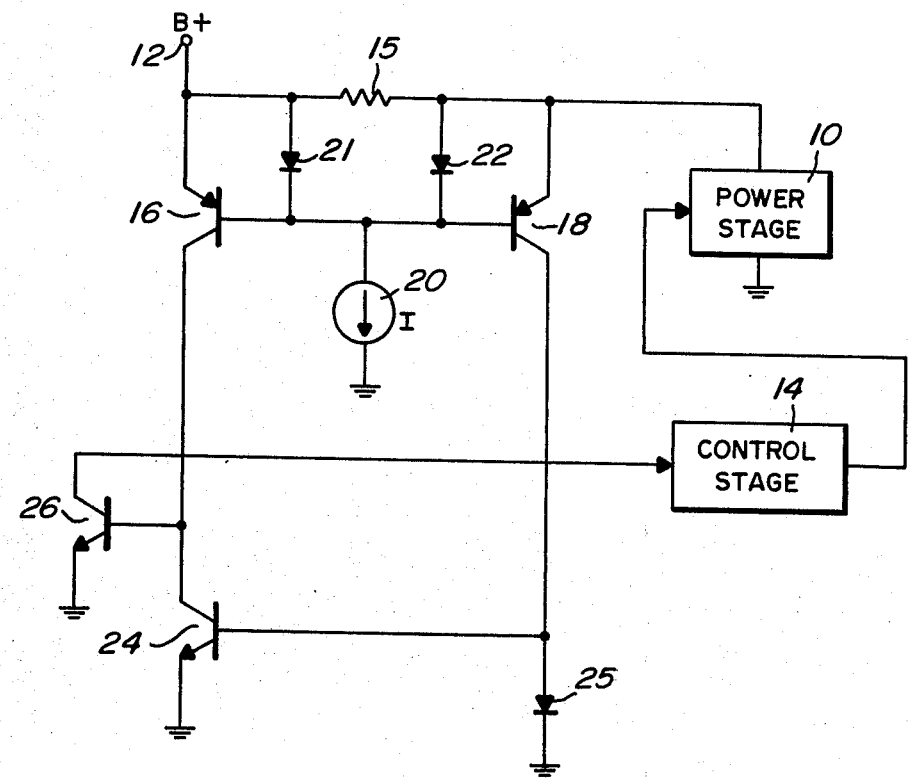
FIG. 1 is a circuit diagram of the protection network of the invention with connections to a device to be protected.

In FIG. 1 of the drawing, a stage 10 is energized from a current supply 12, and under certain conditions might draw sufficient current to damage the stage 10. The stage 10 can be a known power stage, such as the output stage of a radio transmitter. A control stage 14 is coupled to the power stage 10 and this can also be a known stage which turns off the power stage or reduces the current drawn thereby.

The protection network of the invention includes a sense resistor 15 through which energizing current is applied to the power stage 10 from the supply terminal 12. Transistors 16 and 18, of the PNP type, are connected to form a high gain differential amplifier. The emitter electrodes of the transistors 16 and 18 are connected to the two ends of the sense resistor 15, and the base electrodes are connected together and through current limiting device 20 to ground. The device 20 can be a resistor having a relatively large value. A diode 21 is connected across the emitter and base electrodes of transistor 16, and another diode 22 is connected across the emitter and base electrodes of transistor 18. The current through device 20 is divided between diodes 21 and 22, neglecting the very small emitter to base currents of the transistors 16 and 18.

A load circuit is connected to the collector electrodes of the transistors 16 and 18, which may be a known differential to single ended converter circuit including transistor 24 and diode 25. The transistor 24 is of the NPN type with its collector electrode connected to the collector electrode of transistor 16 and its emitter electrode connected to ground. The diode 25 is connected between the collector electrode of transistor 18 and ground, and is also connected across the base and emitter electrodes of transistor 24. A second NPN transistor 26 has its base electrode connected to the collector electrodes of transistors 16 and 24, and its collector electrode connected to the control stage 14.

Considering now the operation of the protection network, the transistor 24 is normally conducting, and this holds transistor 26 cut off so that it exercises no control on the stage 14. As previously stated, the current through device 20 is divided between diodes 21 and 22, and the currents through the diodes control the collector current of the transistors 16 and 18, respectively, in accordance with the areas of the junctions. We will assume that the diodes 21 and 22 are identical, and that the area of the emitter-base junction of transistor 16 is the same as that of the diodes, and that the area of the emitter-base junction of transistor 18 is two times that of the other junctions. The protection circuit is adapted to be constructed as an integrated circuit and the diodes 21 and 22 may be formed as PNP transistors with the base and collector electrodes connected together. The transistor 18 can be provided as two parallel transistors of the same dimensions, or as a PNP transistor having an emitter-base junction area twice that of transistor 16.

The sense resistor 15 can be quite small so that the power consumed thereby is minimized. The current drain by stage 10 will cause a voltage drop across resistor 15 so that the current through diode 22 will normally be slightly less than that through diode 21. For example, the current through diode 21 can be 6 milliamps, and the current through diode 22 can be 5 milliamps, for a total current through device 20 of 11 milliamps. Then the current through the collector of transistor 16 will also be 6 milliamps, and the current through the collector of transistor 18, which is two times that through diode 22 will be 10 milliamps. Assuming that the diode 25 is formed by a NPN transistor identical to transistor 24, the 10 milliamps through the diode 25 will allow the same current through transistor 24, and since transistor 16 is applying only 6 milliamps, the transistor 24 will saturate and remain conducting.

When the current drawn by the stage 10 increases such that the current through diode 22 falls below half that through diode 21, to a value of 3.5 milliamps, for example, the trip point has been reached. As the total current remains at approximately 11 milliamps, the current through diode 21 will increase to 7.5 milliamps as the current through diode 22 decreases to 3.5 milliamps. The transistor 24 will then cut off and transistor 26 will conduct, as the current through transistor 18 and diode 25 will fall to 7.0 milliamps and the transistor 24 cannot conduct the 7.5 milliamps supplied by transistor 16. Accordingly, transistor 26 will conduct to apply a ground to the control stage 14 to cause the same to provide the control action.

A further control of the change in current through sense resistor 15 which is required to turn on transistor 26, that is control of the trip point of the protection circuit, can be provided by rationing the areas of the junctions of diode 25 and transistor 24. For example, the emitter-base junction of transistor 24 can have an area two times that of diode 25, so that the transistor 24 will conduct twice as much current as diode 25. This will hold transistor 24 conducting until the current through sense resistor 15 increases to the point that the current through diode 22 falls below 2.2 milliamps, with the current through diode 21 rising to 8.8 milliamps. Then the current through transistor 18 will be 4.4 milliamps, and 24 will conduct 8.8 milliamps. Transistor 24 can, therefore, still conduct the current supplied by transistor 16. When the current through sense resistor 15 increases further and the current through diode 22 falls below 2.2 milliamps, to 2.0 milliamps for example, the current through transistor 18 and diode 25 will fall to 4.0 milliamps, and transistor 24 conducts 8.0 milliamps, so that transistor 24 cannot conduct the current of 9.0 milliamps applied by transistor 16. The transistor 24 will, therefore, block and transistor 26 is rendered conducting to activate control stage 14.

In the example given, area ratios of 2 to 1 have been used, but it is obvious that other ratios can be provided. Only one junction area need be changed if this provides adequate range for the trip point, or two or more areas can be changed for a wider range of trip points. Changing of the junction areas can be easily and accurately achieved in the construction of an integrated circuit.

Figure 2:
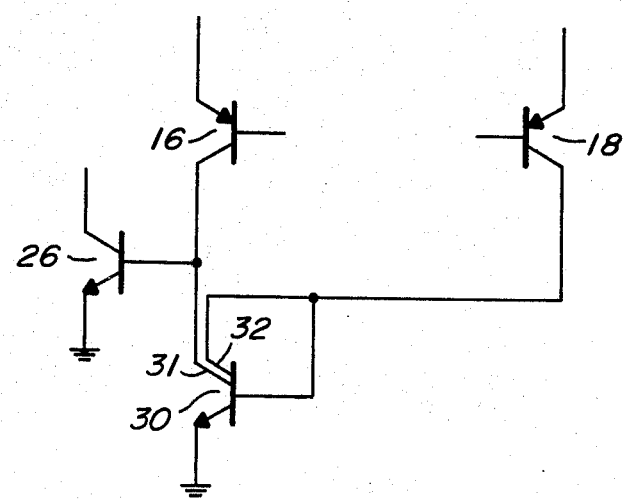
FIG. 2 shows a modification of the circuit of FIG. 1.

FIG. 2 shows a modification of the circuit of FIG. 1 which may be advantageous in some applications. In this circuit, the transistor 24 and diode 25 which form the load circuit are replaced by a single multiple collector transistor 30, as described and claimed in U.S. Pat. No. 3,872,323 issued Mar. 18, 1975 to Thomas M. Frederiksen and Dan William Zobel, and assigned to Motorola, Inc. This construction has the advantage that less chip area is required for the integrated circuit. The transistor 30 has a first collector electrode 31 connected to the collector electrode of transistor 16, and a second collector electrode 32 connected to the base electrode and forming a diode. The collector electrode 32 is connected to the collector electrode of transistor 18, so that the diode formed connects the collector electrode of transistor 18 to ground. By making the collector electrode 31 larger than the collector electrode 32, the collector electrode 31 will carry more current to provide the same effect as making the junction area of transistor 24 larger than that of diode 25 in the circuit of FIG. 1.

The protection circuit of the invention has the advantage that it can be constructed in integrated circuit form and the trip point does not change because of process variations as it depends only upon area ratios, which can be accurately controlled. Also, a wide range of current protection can be provided by changing the area ratios, without changing the sense resistor. The sense resistor can be small so that minimum power is consumed by the protection circuit. Because the control is produced by area ratios, the trip point does not change with changes in temperature, or changes in supply voltage. Further, since only two resistors are required in the protection network, it can be provided as a small and simple integrated circuit.

I claim:
1. A current protection network for a device which is energized by a current supply, including in combination,
   a sense resistor for connecting the device to the supply for applying current to the device,
   a differential circuit including first and second transistors having emitter electrodes connected to the opposite ends of said sense resistor, said transistors having base electrodes which are connected together, and collector electrodes, current limiting means connecting said base electrodes to a reference point for the current supply, and a load circuit connected to said collector electrodes of said first and second transistors, and
   first and second diodes connected between said emitter and base electrodes of said first and second transistors, respectively, whereby the current through said current limiting means is divided between said diodes, said diodes being connected with the same polarity as the emitter to base junctions of said transistors,
   one of said transistors having a junction area different from that of said other transistor to control the current through said one transistor and thereby control the operation of said load circuit.

2. A protection network in accordance with claim 1, wherein said load circuit has a first state in response to a voltage drop across said sense resistor which is below a predetermined value and a second state when the current drawn by the device reached a value such that the voltage drop across said sense resistor reaches the predetermined value.

3. A protection network in accordance with claim 2, wherein said first transistor is connected to the end of said sense resistor connected to the supply, wherein the junction areas of said first transistor and said first diode are the same, and wherein the junction area of said second transistor is greater than the junction area of said second diode.

4. A protection network in accordance with claim 3, wherein said load circuit remains in said first state as long as the current through said second transistor is equal to or greater than the current through said first transistor, and wherein said load circuit changes to said second state in response to current drawn by the device sufficient to produce a voltage drop across said sense resistor which reduces the voltage across said second diode to reduce and the current therethrough and the current through said second transistor so that it is less than the current through said first transistor.

5. A protection network in accordance with claim 1 wherein said load circuit includes semiconductor means having a first junction connecting said collector electrode of said first transistor to the reference point, and a second junction connecting said collector electrode of said second transistor to the reference point, and wherein the current through said second junction controls the conductivity of said first junction.

6. A protection network in accordance with claim 5 wherein said first junction functions as a transistor having a base electrode for controlling the current through the junction thereof, and said second junction functions as a diode connected to said base electrode.

7. A protection network in accordance with claim 6 wherein the area of said first junction is greater than the area of said second junction.

8. A protection network in accordance with claim 7 wherein said first and second diodes have junctions of the same area, and wherein the junction of said second transistor has an area greater than that of said first transistor.

9. A protection network in accordance with claim 5 wherein said semiconductor device is a multiple collector transistor, with a first collector electrode thereof connected to said collector electrode of said first transistor and a second collector electrode connected to said collector electrode of said second transistor and to the base electrode of said multiple collector transistor, said multiple collector transistor having an emitter electrode connected to said reference point so that said second collector electrode thereof forms a diode connected to said base electrode for controlling the current through said first collector electrode.

10. A protection network in accordance with claim 9 wherein said first collector electrode of said multiple collector transistor has a larger junction area than said second collector electrode thereof.

* * * * *